United States Patent
Hu et al.

(10) Patent No.: US 11,822,192 B2
(45) Date of Patent: Nov. 21, 2023

(54) REFLECTIVE ELECTRODE, AND ARRAY SUBSTRATE AND DISPLAY DEVICE THEREOF

(71) Applicants: HEFEI XINSHENG OPTOELECTRONICS TECHNOLOGY CO., LTD., Anhui (CN); BOE TECHNOLOGY GROUP CO., LTD, Beijing (CN)

(72) Inventors: Haifeng Hu, Beijing (CN); Ting Zeng, Beijing (CN); Zhanqi Xu, Beijing (CN); Zhongzheng Yang, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 818 days.

(21) Appl. No.: 16/958,326

(22) PCT Filed: Aug. 6, 2019

(86) PCT No.: PCT/CN2019/099442
§ 371 (c)(1),
(2) Date: Jun. 26, 2020

(87) PCT Pub. No.: WO2021/022477
PCT Pub. Date: Feb. 11, 2021

(65) Prior Publication Data
US 2022/0382092 A1 Dec. 1, 2022

(51) Int. Cl.
*H01L 27/12* (2006.01)
*G02F 1/1343* (2006.01)
(Continued)

(52) U.S. Cl.
CPC ........ *G02F 1/13439* (2013.01); *G02F 1/1368* (2013.01); *H01L 27/124* (2013.01); *G02F 1/133723* (2013.01); *G02F 2203/02* (2013.01)

(58) Field of Classification Search
None
See application file for complete search history.

(56) References Cited

U.S. PATENT DOCUMENTS

2005/0162591 A1  7/2005  Hashimoto
2022/0382092 A1*  12/2022  Hu .................... G02F 1/133553

FOREIGN PATENT DOCUMENTS

CN  1619362 A   5/2005
CN  108172694 A  6/2018
(Continued)

OTHER PUBLICATIONS

International Search Report dated Apr. 30, 2020 for PCT Application No. PCT/CN2019/099442, 8 pages with English Translation.
(Continued)

*Primary Examiner* — Jack S Chen
(74) *Attorney, Agent, or Firm* — Dave Law Group, LLC; Raj S. Dave

(57) ABSTRACT

The present disclosure relates to a reflective electrode and an array substrate and a display device thereof. The reflective electrode includes a reflective conductive layer and a color compensation layer located on the reflective conductive layer. The reflective conductive layer has a first reflectivity to first light having a first wavelength and a second reflectivity to second light having a second wavelength. The first light and the second light are combined into white light. The first reflectivity is smaller than the second reflectivity. The color compensation layer is configured such that the reflective electrode has a third reflectivity to the first light and a fourth reflectivity to the second light. A ratio of an absolute value of a difference between the third reflectivity and the (Continued)

fourth reflectivity to the third reflectivity is smaller than 16.4%.

20 Claims, 3 Drawing Sheets

(51) Int. Cl.
*G02F 1/1368* (2006.01)
*G02F 1/1337* (2006.01)

(56) References Cited

FOREIGN PATENT DOCUMENTS

| CN | 109387966 A | 2/2019 |
|---|---|---|
| JP | H112707 A | 1/1999 |
| JP | 2008-134673 A | 6/2008 |

OTHER PUBLICATIONS

Written Opinion dated Apr. 30, 2020 for PCT Application No. PCT/CN2019/099442, 7 pages with English Translation.

* cited by examiner

REFLECTIVE ELECTRODE, AND ARRAY SUBSTRATE AND DISPLAY DEVICE THEREOF

CROSS-REFERENCE TO RELATED APPLICATIONS

This application is the National Stage Entry of PCT/CN2019/099442, filed on Aug. 6, 2019, the entire disclosure of which is incorporated herein by reference as part of the disclosure of this application.

FIELD

Embodiments of the present disclosure relate to a field of displaying technology, in particular, to a reflective electrode, and an array substrate and a display device thereof.

BACKGROUND

With the development of display technology, display panels have been widely used in people's life. Reflective display panels are gaining more and more attention because of their advantages such as no backlight and low power consumption.

BRIEF DESCRIPTION

Embodiments of the present disclosure provide a reflective electrode, and an array substrate and a display device thereof.

In one aspect of the present disclosure, a reflective electrode is provided. The reflective electrode includes a reflective conductive layer and a color compensation layer located on the reflective conductive layer. The reflective conductive layer has a first reflectivity to first light having a first wavelength and a second reflectivity to second light having a second wavelength. The first light and the second light are combined into white light. The first reflectivity is smaller than the second reflectivity. The color compensation layer is configured such that the reflective electrode has a third reflectivity to the first light and a fourth reflectivity to the second light. A ratio of an absolute value of a difference between the third reflectivity and the fourth reflectivity to the third reflectivity is smaller than 16.4%.

In an embodiment of the present disclosure, a range of the first wavelength is 420-460 nm. A range of the second wavelength is 550-600 nm. A range of the third reflectivity is 0.79-0.93. A range of the fourth reflectivity is 0.84-0.92.

In an embodiment of the present disclosure, the color compensation layer includes a stack of at least one layer having a first refractive index and at least one layer having a second refractive index. The first refractive index is greater than the second refractive index.

In an embodiment of the present disclosure, the stack includes a first layer having a refractive index of 2.34 and a thickness of 30 nm, a second layer having a refractive index of 1.4 and a thickness of 90 nm, a third layer having a refractive index of 2.34 and a thickness of 65 nm, and a fourth layer having a refractive index of 1.4 and a thickness of 60 nm which are sequentially stacked. The first layer is a layer located closest to the reflective conductive layer in the stack.

In an embodiment of the present disclosure, a material of the first layer and the third layer includes $Nb_2O_5$. A material of the second layer and the fourth layer includes $SiO_2$.

In an embodiment of the present disclosure, a range of the third reflectivity is 0.9-0.93, and a range of the fourth reflectivity is 0.87-0.92.

In an embodiment of the present disclosure, the stack includes a first layer having a refractive index of 2.0 and a thickness of 45 nm, a second layer having a refractive index of 1.4 and a thickness of 90 nm, a third layer having a refractive index of 2.0 and a thickness of 80 nm, and a fourth layer having a refractive index of 1.4 and a thickness of 60 nm which are sequentially stacked. The first layer is a layer located closest to the reflective conductive layer in the stack.

In an embodiment of the present disclosure, a material of the first layer and the third layer includes SiN. A material of the second layer and the fourth layer includes $SiO_2$.

In an embodiment of the present disclosure, a range of the third reflectivity is 0.79-0.84, and a range of the fourth reflectivity is 0.84-0.88.

In an embodiment of the present disclosure, when light incident on the reflective electrode is the white light, a value of the parameter B in a CIE LAB chromaticity coordinate system of the light reflected by the reflective electrode is smaller than or equal to 2.63.

In an embodiment of the present disclosure, the value of B is −0.74.

In an embodiment of the present disclosure, the reflective electrode further includes a light transmissive layer located on the color compensation layer. The light transmissive layer has a first transmissivity to the first light and a second transmissivity to the second light. The first transmissivity is smaller than the second transmissivity.

In the embodiments of the present disclosure, a range of the thickness of the light transmissive layer is 60-120 nm.

In an embodiment of the present disclosure, a material of the light transmissive layer is polyimide.

In an embodiment of the present disclosure, the reflective conductive layer includes a metal layer and a transparent conductive layer located on the metal layer.

In an embodiment of the present disclosure, the metal includes silver, and the transparent conductive layer includes indium tin oxide.

In another aspect of the present disclosure, an array substrate is provided. The array substrate includes: a substrate; a thin film transistor located on the substrate; and the reflective electrode as described above located on the thin film transistor. The reflective electrode is connected to a source/drain electrode layer of the thin film transistor.

In yet another aspect of the present disclosure, a display device is provided. The display device includes the array substrate as described above.

Adaptive and further aspects and scope will become apparent from the description provided herein. It should be understood that various aspects of this disclosure may be implemented individually or in combination with one or more other aspects. It should also be understood that the description and specific examples herein are intended for purposes of illustration only and are not intended to limit the scope of the present disclosure.

BRIEF DESCRIPTION OF THE DRAWINGS

The drawings described herein are for illustrative purposes only of selected embodiments and not all possible implementations, and are not intended to limit the scope of the present application.

Corresponding reference numerals indicate corresponding parts or features throughout the several views of the drawings.

DETAILED DESCRIPTION

Figure 1:
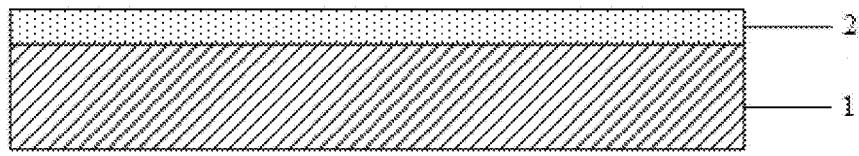
FIG. 1 shows a schematic cross-sectional view of a reflective electrode according to an embodiment of the present disclosure.

As used herein and in the appended claims, the singular form of a word includes the plural, and vice versa, unless the context clearly dictates otherwise. Thus, the references "a", "an", and "the" are generally inclusive of the plurals of the respective terms. Similarly, the words "comprise", "comprises", and "comprising" are to be interpreted inclusively rather than exclusively. Likewise, the terms "include", "including" and "or" should all be construed to be inclusive, unless such a construction is clearly prohibited from the context. The term "example" used herein, particularly when followed by a listing of terms, is merely exemplary and illustrative and should not be deemed to be exclusive or comprehensive.

Additionally, further to be noted, when the elements and the embodiments thereof of the present application are introduced, the articles "a/an", "one", "the" and "said" are intended to represent the existence of one or more elements. Unless otherwise specified, "a plurality of" means two or more. The expressions "comprise", "include", "contain" and "have" are intended as inclusive and mean that there may be other elements besides those listed. The terms such as "first" and "second" are used herein only for purposes of description and are not intended to indicate or imply relative importance and the order of formation.

In addition, in the drawings, the thickness and area of each layer are exaggerated for clarity. It should be understood that when a layer, a region, or a component is referred to as being "on" another part, it is meant that it is directly on the another part, or there may be other components in between. In contrast, when a certain component is referred to as being "directly" on another component, it is meant that no other component lies in between.

The flow diagrams depicted herein are just one example. There may be many variations to this diagram or the steps (or operations) described therein without departing from the spirit of the disclosure. For instance, the steps may be performed in a differing order or steps may be added, deleted or modified. All of these variations are considered a part of the claimed disclosure.

Exemplary embodiments will now be described more fully with reference to the accompanying drawings.

Reflective display devices provide a display light source by reflecting ambient light. However, when the ambient light is dim, the application range of the reflective display device is limited due to the low brightness.

Currently, a material of the reflective electrode of the reflective display device employs a metal (for example, Al) and/or an alloy (for example, AlNd). However, Al or AlNd has a low level of reflectivity to light, which also limits the application range of the reflective display device.

Through extensive research, the inventor found that when Ag is used as the material of the reflective electrode, the reflective electrode has a high reflectivity to light. However, since Ag deteriorates during use, the color of light reflected by the reflective electrode becomes yellowish, thereby affecting the displaying effect of the display device.

In addition, in the case of a reflective liquid crystal display device, it is necessary to form a liquid crystal alignment layer on the reflective electrode. The liquid crystal alignment layer also reduces the reflectivity of the reflective electrode to light of a specific wavelength. For example, when the liquid crystal alignment layer is a polyimide layer, the reflectivity of the reflective electrode to blue light is reduced, which causes the light reflected by the reflective electrode to entirely become yellowish.

The present disclosure provides a reflective electrode, which can improve the reflective characteristics of the reflective electrode in the visible light range (380 nm-780 nm), so as to obtain white light or composite light close to white light, thereby improving the displaying effect of the display device.

FIG. 1 shows a schematic cross-sectional view of a reflective electrode according to an embodiment of the present disclosure. As shown in FIG. 1, the reflective electrode 10 includes a reflective conductive layer 1 and a color compensation layer 2 located on the reflective conductive layer 1.

In an embodiment of the present disclosure, the reflective conductive layer 1 has a first reflectivity R1 to first light L1 having a first wavelength W1 and a second reflectivity R2 to second light L2 having a second wavelength W2. In an exemplary embodiment of the present disclosure, the first light L1 and the second light L2 can be combined into white light. In an exemplary embodiment of the present disclosure, the first reflectivity R1 may be smaller than the second reflectivity R2.

In an embodiment of the present disclosure, the color compensation layer 2 is configured such that the reflective electrode 10 (that is, a stack including the reflective conductive layer 1 and the color compensation layer 2) has a third reflectivity R3 to the first light L1 and has a fourth reflectivity R4 to the second light L2. In an exemplary embodiment of the present disclosure, a ratio of an absolute value of a difference between the third reflectivity R3 and the fourth reflectivity R4 to the third reflectivity R3 (|R3-R4|/R3) may be smaller than 16.4%.

In an exemplary embodiment of the present disclosure, a range of the first wavelength W1 may be 420-460 nm, and a range of the second wavelength W2 may be 550-600 nm. In an exemplary embodiment of the present disclosure, a range of the third reflectivity R3 may be 0.79-0.93, and a range of the fourth reflectivity R4 may be 0.84-0.92.

In an exemplary embodiment of the present disclosure, the first light may include blue light, and the second light may include yellow light. It should be noted that, since the reflectivity of the reflective conductive layer 1 to the first light (i.e., the blue light) is smaller than the reflectivity to the second light (i.e., the yellow light), the intensity of the reflected yellow light is greater than the intensity of the reflected blue light, so as to obtain yellowish composite light (i.e., the reflected light), thereby causing the display screen of the display device to become yellowish.

Therefore, the embodiment of the present disclosure provides a color compensation layer 2 capable of compensating for the difference between the reflectivity of the reflective conductive layer 1 to the blue light and the reflectivity of the reflective conductive layer 1 to the yellow light, such that the ratio of the absolute value of the difference between the third reflectivity R3 (i.e., the reflectivity of the reflective electrode 10 to the blue light) and the fourth reflectivity R4 (i.e., the reflectivity of the reflective electrode 10 to the yellow light) to the third reflectivity R3 (|R3-R4|/R3) is controlled to be smaller than 16.4%. Thus, the light reflected by the reflective electrode can be as close as possible to the white light, thereby improving the displaying effect of the display device.

In an embodiment of the present disclosure, the color compensation layer includes a stack of at least one layer having a first refractive index and at least one layer having a second refractive index. As an example, the stack may include two layers, three layers, or four layers, etc., which is not specifically limited herein. In an exemplary embodiment of the present disclosure, the first refractive index is greater than the second refractive index. In an exemplary embodiment of the present disclosure, the layer located closest to the reflective conductive layer in the stack is the layer having the first refractive index. It should be noted that, the color compensation layer (i.e., the stack) of the embodiment of the present disclosure applies the principle destructive interference, so that the intensity of the yellow light reflected by the reflective conductive layer decreases after passing through the color compensation layer, thereby reducing the reflectivity of the reflective electrode to the yellow light.

Figure 2:
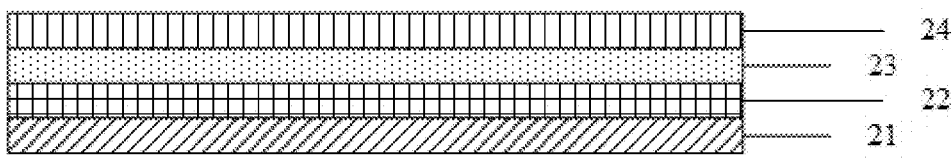
FIG. 2 shows a schematic cross-sectional view of a color compensation layer according to an embodiment of the present disclosure.

FIG. 2 shows a schematic cross-sectional view of a color compensation layer according to an embodiment of the present disclosure. In an embodiment of the present disclosure, the color compensation layer 2 may include two types of structures, namely, a first stack and a second stack.

Specifically, referring to FIG. 2, in an exemplary embodiment of the present disclosure, the first stack may include a first layer 21 having a refractive index of 2.34 and a thickness of 30 nm, a second layer 22 having a refractive index of 1.4 and a thickness of 90 nm, a third layer 23 having a refractive index of 2.34 and a thickness of 65 nm, and a fourth layer 24 having a refractive index of 1.4 and a thickness of 60 nm which are sequentially stacked. In an embodiment of the present disclosure, the first layer 21 is the layer located closest to the reflective conductive layer 1 in the first stack.

In an exemplary embodiment of the present disclosure, as an example, a material of the first layer 21 and the third layer 23 may include Nb2O5. As an example, a material of the second layer 22 and the fourth layer 24 may include SiO2.

In an embodiment of the present disclosure, referring still to FIG. 2, in another exemplary embodiment of the present disclosure, the second stack may include a first layer 21 having a refractive index of 2.0 and a thickness of 45 nm, a second layer 22 having a refractive index of 1.4 and a thickness of 90 nm, a third layer 23 having a refractive index of 2.0 and a thickness of 80 nm, and a fourth layer 24 having a refractive index of 1.4 and a thickness of 60 nm which are sequentially stacked. In an exemplary embodiment of the present disclosure, the first layer 21 is the layer located closest to the reflective conductive layer 1 in the second stack.

In an embodiment of the present disclosure, as an example, a material of the first layer 21 and the third layer 23 include SiN. As an example, a material of the second layer 22 and the fourth layer 24 include SiO2.

Figure 3:
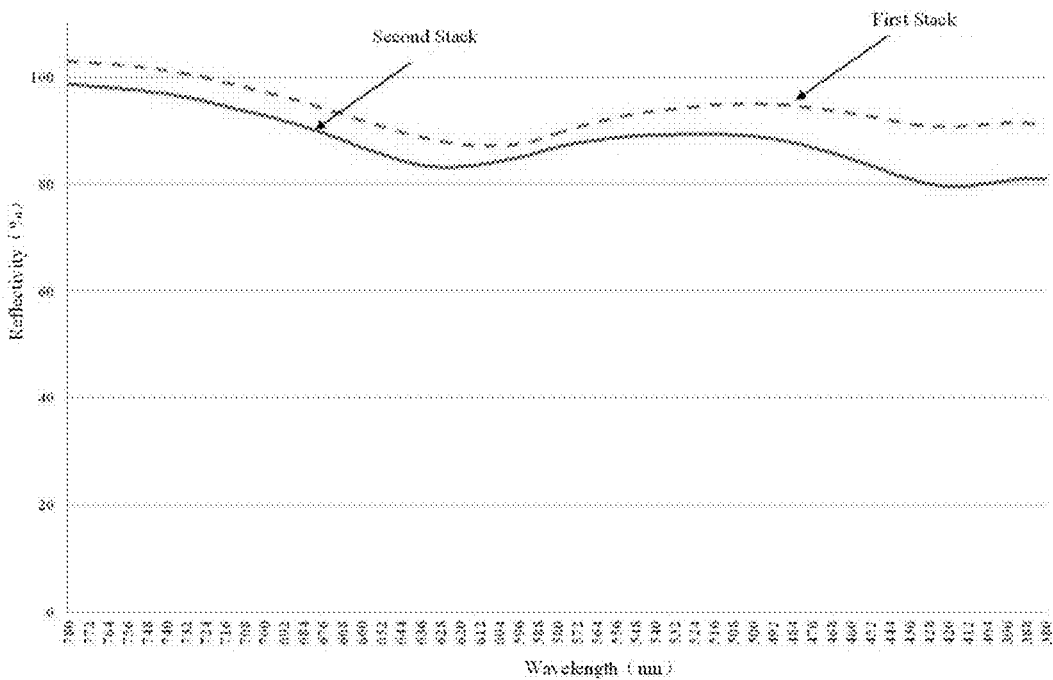
FIG. 3 shows a curve diagram of the reflectivity of the reflective electrode to light in the wavelength range of 380 nm-780 nm according to an embodiment of the present disclosure.

FIG. 3 shows a curve diagram of the reflectivity of the reflective electrode to light in the wavelength range of 380 nm-780 nm according to an embodiment of the present disclosure. In FIG. 3, the broken line represents the reflectivity curve of the reflective electrode 10 to the light in the wavelength range of 380 nm-780 nm when the color compensation layer is the first stack. In FIG. 3, the solid line represents the reflectivity curve of the reflective electrode 10 to the light in the wavelength range of 380 nm-780 nm when the color compensation layer is the second stack.

Figure 4A:
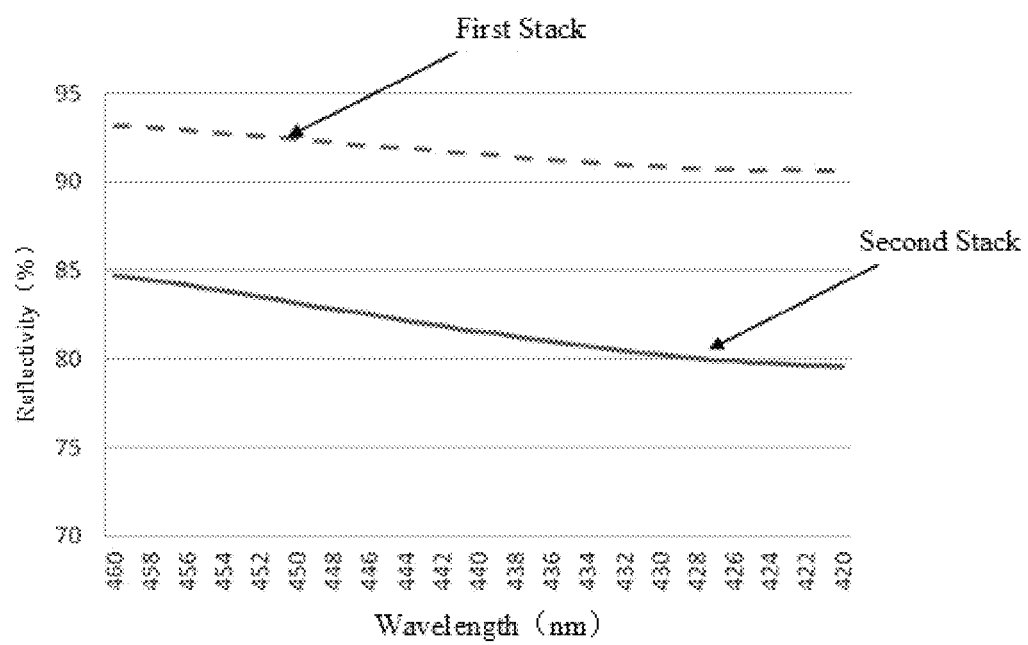
FIGS. 4a and 4b show enlarged views of parts of the wavelength range in FIG. 3.
Figure 4B:
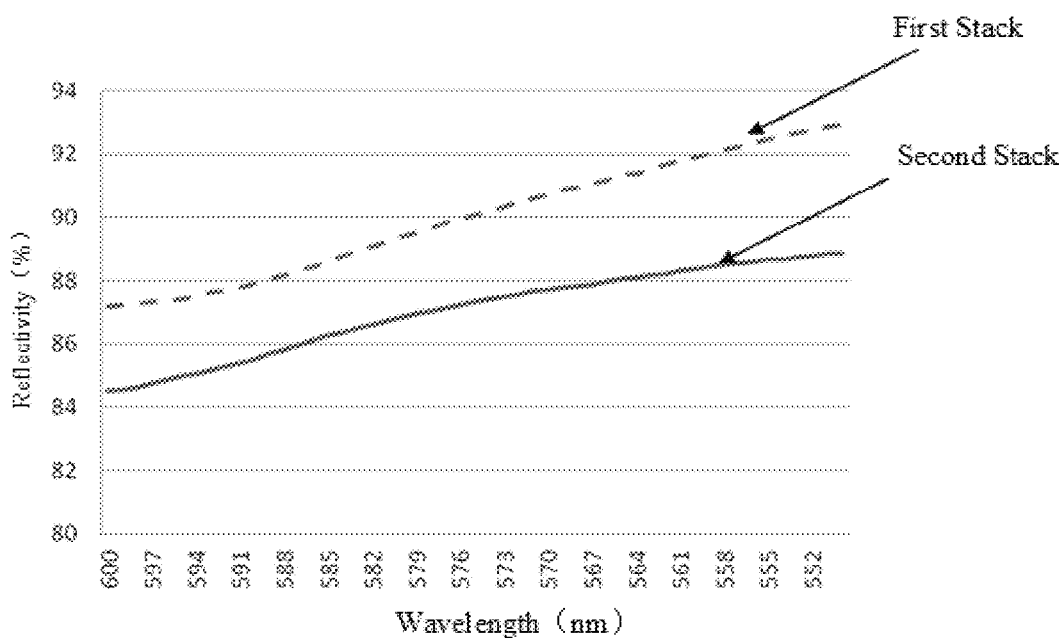

FIGS. 4a and 4b show enlarged views of parts of the wavelength range in FIG. 3. FIG. 4a shows a curve diagram of the reflectivity of the reflective electrode to the first light in the wavelength range of 420 nm-460 nm according to an embodiment of the present disclosure. FIG. 4b shows a curve diagram of the reflectivity of the reflective electrode to the second light in the wavelength range of 550 nm-600 nm according to the embodiment of the present disclosure.

Shown in FIG. 4a is curves of the reflectivity of the reflective electrode 10 including the first stack and the second stack, respectively, to the first light in the wavelength range of 420 nm-460 nm. Shown in FIG. 4b is curves of the reflectivity of the reflective electrode 10 including the first stack and the second stack, respectively, to the second light in the wavelength range of 550 nm-600 nm.

In an embodiment of the present disclosure, FIG. 4a shows curves of the reflectivity of the reflective electrode 10 to the blue light. In FIG. 4a, the broken line represents a reflectivity curve of the reflective electrode 10 including the first stack to the blue light, and the solid line represents a reflectivity curve of the reflective electrode 10 including the second stack to the blue light.

In an embodiment of the present disclosure, FIG. 4b shows curves of the reflectivity of the reflective electrode 10 to the yellow light. In FIG. 4b, the broken line represents a reflectivity curve of the reflective electrode 10 including the first stack to the yellow light, and the solid line represents a reflectivity curve of the reflective electrode 10 including the second stack to the yellow light.

As can be seen from FIGS. 4a and 4b, in the case where the reflective electrode 10 includes the first stack, a range of the third reflectivity R3 (that is, the reflectivity of the reflective electrode 10 to the blue light) is 0.9 to 0.93, and a range of the fourth reflectivity R4 (that is, the reflectivity of the reflective electrode 10 to the yellow light) is 0.87-0.92. In the case where the reflective electrode 10 includes the second stack, a range of the third reflectivity R3 is 0.79 to 0.84, and a range of the fourth reflectivity R4 is 0.84 to 0.88.

In an embodiment of the present disclosure, when the light incident on the reflective electrode 10 is white light, the value of the parameter B in a CIE LAB chromaticity coordinate system of the light reflected by the reflective electrode 10 is smaller than or equal to 2.63.

As an example, in the case where the reflective electrode 10 includes the first stack, the value of B of the light reflected by the reflective electrode 10 is 2.63.

As another example, in the case where the reflective electrode 10 includes the second stack, the value of B of the light reflected by the reflective electrode 10 is −0.74.

Figure 5:
FIG. 5 shows a schematic cross-sectional view of a reflective conductive layer according to an embodiment of the present disclosure.

FIG. 5 shows a schematic cross-sectional view of a reflective conductive layer according to an embodiment of the present disclosure. In the embodiment of the present disclosure, the reflective conductive layer 1 may include a metal layer 11 and a transparent conductive layer located on the metal layer 11.

In an exemplary embodiment of the present disclosure, a material of the metal 11 may include silver. In an exemplary embodiment of the present disclosure, a material of the transparent conductive layer 12 may include indium tin oxide (ITO). It should be understood that, the transparent conductive layer 12 may be used to prevent the metal layer from being oxidized without affecting the reflective characteristics of the metal layer.

Figure 6:
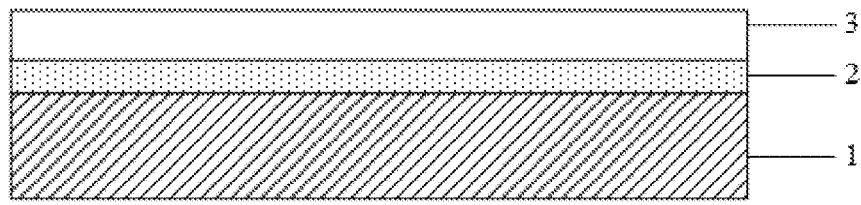
FIG. 6 shows a schematic cross-sectional view of a reflective electrode according to an embodiment of the present disclosure.

FIG. 6 shows a schematic cross-sectional view of a reflective electrode according to an embodiment of the present disclosure. In the embodiment of the present disclosure, when applied to a reflective liquid crystal display device, optionally, as shown in FIG. 6, the reflective electrode 10 may further include a light transmissive layer 3 located on the color compensation layer 2. It should be noted that, the light transmissive layer 3 is used as a liquid crystal alignment layer.

In an embodiment of the present disclosure, the light transmissive layer 3 has a first transmissivity T1 to the first light L1 and a second transmissivity T2 to the second light L2. The first transmissivity T1 is smaller than the second transmissivity T2.

In an exemplary embodiment of the present disclosure, a range of the thickness of the light transmissive layer 3 may be 60-120 nm.

In an exemplary embodiment of the present disclosure, a material of the light transmissive layer 3 may be polyimide.

The embodiment of the present disclosure also provide a method for manufacturing a reflective electrode. The method may include providing a reflective conductive layer and forming a color compensation layer on the reflective conductive layer.

In an embodiment of the present disclosure, providing the reflective conductive layer may include: depositing a metal layer on a given substrate; depositing a transparent conductive layer on the metal layer; and patterning the metal layer and the transparent conductive layer to form the reflective conductive layer.

In an embodiment of the present disclosure, forming the color compensation layer may include: depositing a color compensation material layer on the given substrate and the reflective conductive layer; and patterning the color compensation material layer to form the color compensation layer.

As an example, in the case where the color compensation layer includes the above-mentioned first stack or second stack, depositing the color compensation material layer may include sequentially depositing the first layer 21, the second layer 22, the third layer 23, and the fourth layer 24. It should be noted that the specific details of the first layer to the fourth layer are as described above and will not be repeated here.

The embodiment of the present disclosure also provides an array substrate. The array substrate may include: a substrate; a thin film transistor located on the substrate; and the reflective electrode as described above located on the thin film transistor.

Figure 7:
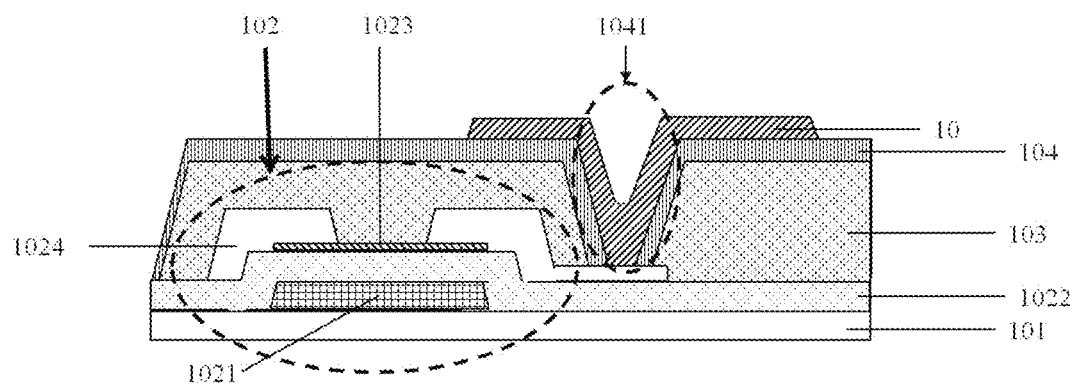
FIG. 7 shows a schematic cross-sectional view of an array substrate according to an embodiment of the present disclosure.

FIG. 7 shows a schematic cross-sectional view of an array substrate according to an embodiment of the present disclosure. As shown in FIG. 7, the array substrate 100 includes: a substrate 101; a thin film transistor 102 located on the substrate 101; and a reflective electrode 10 located on the thin film transistor. In an embodiment of the present disclosure, the reflective electrode 10 may be connected to a source/drain electrode layer of the thin film transistor 102, as described below.

Specifically, in an exemplary embodiment of the present disclosure, as shown in FIG. 7, the thin film transistor 102 may include: a gate 1021 located on the substrate 101; a gate insulating layer 1022 covering the substrate 101 and the gate 1021; an active layer 1023 located on the gate insulating layer 1022; and a source/drain electrode layer 1024 located on the gate insulating layer 1022 and the active layer 1023. It can be understood that the materials of each layer of the thin film transistor 102 may employ common materials known in the art, which will not be specifically limited herein.

In an exemplary embodiment of the present disclosure, the array substrate 100 further includes: a buffer layer 103 located between the thin film transistor 102 and the reflective electrode 10; and a passivation layer 104 located between the buffer layer 103 and the reflective electrode 10. The passivation layer 104 has a hole 1041 exposing the source/drain electrode layer 1024 of the thin film transistor 102. The reflective electrode 10 is connected to the source/drain electrode layer 1024 of the thin film transistor 102 via a hole 1041. As an example, a material of the buffer layer 103 may include an organic material. It should be understood that the material of the passivation layer 104 may employ common materials known in the art, which will not be specifically limited herein.

For a detailed description of the reflective electrode 10 in FIG. 7, reference may be made to the descriptions in FIGS. 1-6, and details will not be repeated here.

The embodiment of the present disclosure also provides a display device. The display device includes the array substrate as described above.

Figure 8:
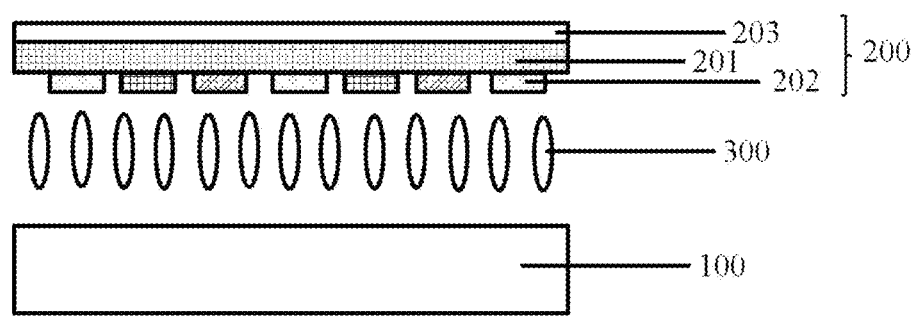
FIG. 8 shows a schematic cross-sectional view of a display device according to an embodiment of the present disclosure.

FIG. 8 shows a schematic cross-sectional view of a display device according to an embodiment of the present disclosure. As shown in FIG. 8, the display device 1000 includes: an array substrate 100; and a color filter substrate 200 located on the array substrate.

It should be noted that, FIG. 8 shows an embodiment in which the array substrate 100 is applied to a liquid crystal display device. However, the array substrate 100 of the embodiment of the present disclosure can also be applied to other types of display devices, for example, the OLED display device.

As an example, when the display device is a liquid crystal display device, as shown in FIG. 8, the display device 1000 may further include liquid crystal located between the array substrate 100 and the color filter substrate 200. At this time, the display device 1000 functions as a reflective liquid crystal display device.

In an exemplary embodiment of the present disclosure, the color filter substrate 200 may include: a substrate 201; a color filter layer 202 located on a side of the substrate 201 close to the liquid crystal 300; and a polarizer 203 located on a side of the substrate 201 away from the liquid crystal 300. The specific structure of the color filter layer 202 will not be specifically limited herein, and those skilled in the art may design according to actual needs. For example, the color filter layer may include, for example, a red filter, a green filter, and a blue filter.

For a detailed description of the array substrate 100 in FIG. 8, reference may be made to the description in FIG. 7, which will not be repeated here. It should be noted that, as described above, when applied to a reflective liquid crystal display device, the reflective electrode 10 may further include a light transmissive layer 3 as a liquid crystal alignment layer. For a detailed description of the light transmissive layer 3, reference may be made to the above description, which will not be repeated here.

The foregoing description of the embodiment has been provided for purpose of illustration and description. It is not intended to be exhaustive or to limit the application. Even if not specifically shown or described, individual elements or features of a particular embodiment are generally not limited to that particular embodiment, are interchangeable when under a suitable condition, can be used in a selected embodiment and may also be varied in many ways. Such variations are not to be regarded as a departure from the application, and all such modifications are included within the scope of the application.

What is claimed is:

1. A reflective electrode, comprising:
a reflective conductive layer, wherein the reflective conductive layer has a first reflectivity to first light having a first wavelength and a second reflectivity to second light having a second wavelength, and wherein the first light and the second light are combined into white light, and wherein the first reflectivity is smaller than the second reflectivity; and
a color compensation layer located on the reflective conductive layer,
wherein the color compensation layer is configured such that the reflective electrode has a third reflectivity to the first light and a fourth reflectivity to the second light, and wherein a ratio of an absolute value of a difference between the third reflectivity and the fourth reflectivity to the third reflectivity is smaller than 16.4%.

2. The reflective electrode according to claim 1, wherein a range of the first wavelength is 420-460 nm, a range of the second wavelength is 550-600 nm, a range of the third reflectivity is 0.79-0.93, and a range of the fourth reflectivity is 0.84-0.92.

3. The reflective electrode according to claim 2, wherein the color compensation layer comprises a stack of at least one layer having a first refractive index and at least one layer having a second refractive index, and wherein the first refractive index is greater than the second refractive index.

4. The reflective electrode according to claim 3, wherein the stack comprises a first layer having a refractive index of 2.34 and a thickness of 30 nm, a second layer having a refractive index of 1.4 and a thickness of 90 nm, a third layer having a refractive index of 2.34 and a thickness of 65 nm, and a fourth layer having a refractive index of 1.4 and a thickness of 60 nm which are sequentially stacked, and,
wherein the first layer is a layer located closest to the reflective conductive layer in the stack.

5. The reflective electrode according to claim 4, wherein a material of the first layer and the third layer comprises $Nb_2O_5$, and a material of the second layer and the fourth layer comprises $SiO_2$.

6. The reflective electrode according to claim 5, wherein a range of the third reflectivity is 0.9-0.93, and a range of the fourth reflectivity is 0.87-0.92.

7. The reflective electrode according to claim 3, wherein the stack comprises a first layer having a refractive index of 2.0 and a thickness of 45 nm, a second layer having a refractive index of 1.4 and a thickness of 90 nm, a third layer having a refractive index of 2.0 and a thickness of 80 nm, and a fourth layer having a refractive index of 1.4 and a thickness of 60 nm which are sequentially stacked,
wherein the first layer is a layer located closest to the reflective conductive layer in the stack.

8. The reflective electrode according to claim 7, wherein a material of the first layer and the third layer comprises SiN, and a material of the second layer and the fourth layer comprises $SiO_2$.

9. The reflective electrode according to claim 8, wherein a range of the third reflectivity is 0.79-0.84, and a range of the fourth reflectivity is 0.84-0.88.

10. The reflective electrode according to claim 2, wherein when light incident on the reflective electrode is the white light, a value of the parameter B in a CIE LAB chromaticity coordinate system of the light reflected by the reflective electrode is smaller than or equal to 2.63.

11. The reflective electrode according to claim 10, wherein the value of B is −0.74.

12. The reflective electrode according to claim 1, further comprising a light transmissive layer located on the color compensation layer,
wherein the light transmissive layer has a first transmissivity to the first light and a second transmissivity to the second light, and wherein the first transmissivity is smaller than the second transmissivity.

13. The reflective electrode according to claim 12, wherein a range of the thickness of the light transmissive layer is 60 nm-120 nm.

14. The reflective electrode according to claim 12, wherein a material of the light transmissive layer is polyimide.

15. The reflective electrode according to claim 1, wherein the reflective conductive layer comprises a metal layer and a transparent conductive layer located on the metal layer.

16. The reflective electrode according to claim 15, wherein the metal comprises silver and the transparent conductive layer comprises indium tin oxide.

17. The reflective electrode according to claim 16, further comprising a light transmissive layer located on the color compensation layer,
wherein the light transmissive layer has a first transmissivity to the first light and a second transmissivity to the second light, and wherein the first transmissivity is smaller than the second transmissivity.

18. The reflective electrode according to claim 17, wherein a range of the thickness of the light transmissive layer is 60 nm-120 nm, and wherein a material of the light transmissive layer is polyimide.

19. An array substrate, comprising:
a substrate;
a thin film transistor located on the substrate; and
the reflective electrode according to claim 1 located on the thin film transistor, wherein the reflective electrode is connected to a source/drain electrode layer of the thin film transistor.

20. A display device comprising the array substrate according to claim 19.

* * * * *